US006781408B1

(12) United States Patent
Langhammer

(10) Patent No.: US 6,781,408 B1
(45) Date of Patent: Aug. 24, 2004

(54) PROGRAMMABLE LOGIC DEVICE WITH ROUTING CHANNELS

(75) Inventor: Martin Langhammer, Poole (GB)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/132,873

(22) Filed: Apr. 24, 2002

(51) Int. Cl.$^7$ .......................................... H03K 19/177
(52) U.S. Cl. ....................................... 326/41; 326/38
(58) Field of Search ............................. 326/38, 39, 40, 326/41, 47

(56) References Cited

U.S. PATENT DOCUMENTS

| | | | | |
|---|---|---|---|---|
| 3,473,160 | A | | 10/1969 | Wahlstrom ............... 340/172.5 |
| 4,871,930 | A | | 10/1989 | Wong et al. ................ 307/465 |
| 4,912,345 | A | | 3/1990 | Steele et al. ................ 307/465 |
| 5,122,685 | A | | 6/1992 | Chan et al. .............. 307/465.1 |
| 5,128,559 | A | | 7/1992 | Steele ......................... 307/465 |
| 5,371,422 | A | | 12/1994 | Patel et al. .................... 326/41 |
| 5,483,178 | A | | 1/1996 | Costello et al. ............... 326/41 |
| 5,689,195 | A | * | 11/1997 | Cliff et al. ..................... 326/41 |
| 5,744,980 | A | * | 4/1998 | McGowan et al. ........... 326/40 |
| 5,754,459 | A | | 5/1998 | Telikepalli .................. 364/759 |
| 5,825,202 | A | | 10/1998 | Tavana et al. ................ 326/39 |
| 5,874,834 | A | | 2/1999 | New ............................ 326/39 |
| 6,069,487 | A | | 5/2000 | Lane et al. .................... 326/37 |
| 6,215,326 | B1 | | 4/2001 | Jefferson et al. .............. 326/41 |
| 6,362,650 | B1 | * | 3/2002 | New et al. ..................... 326/41 |
| 6,407,576 | B1 | | 6/2002 | Ngai et al. ..................... 326/41 |
| 6,453,382 | B1 | * | 9/2002 | Heile ........................... 711/108 |
| 6,467,017 | B1 | * | 10/2002 | Ngai et al. .................. 711/104 |
| 6,538,470 | B1 | * | 3/2003 | Langhammer et al. ........ 326/41 |
| 6,556,044 | B2 | * | 4/2003 | Langhammer et al. ........ 326/40 |
| 6,628,140 | B2 | * | 9/2003 | Langhammer et al. ........ 326/40 |

FOREIGN PATENT DOCUMENTS

| | | | |
|---|---|---|---|
| EP | 0 461 798 A2 | 12/1991 | ......... H03K/19/177 |
| GB | 2 283 602 A | 5/1995 | ......... H03K/19/177 |

OTHER PUBLICATIONS

"Implementing Multipliers in FLEX 10K EABs", Technical Brief 5, Altera Corporation, Mar. 1996, pp. 1–2.
"Implementing Logic with the Embedded Array in FLEX 10K Devices", Product Information Bulletin 21, ver. 2.1, Altera Corporation, May 2001, pp. 1–20.
"Xilinx Unveils New FPGA Architecture to Enable High–Performance, 10 Million System Gate Designs", Xilinx Virtex–II Architecture Technology Backgrounder, Xilinx Inc., Jun. 22, 2000, pp. 1–9.

(List continued on next page.)

Primary Examiner—Daniel D. Chang
(74) Attorney, Agent, or Firm—Fish & Neave; Robert R. Jackson

(57) ABSTRACT

A programmable logic device (PLD) is provided that includes at least one dedicated output routing channel configured to facilitate the processing of output signals generated by multiple function-specific blocks (FSBs). The output routing channel includes a plurality of functional units that may be programmably selectively chained, wherein each functional unit contains an operational block and output selection logic that are configured to programmably selectively implement any of a variety of operations (e.g., bitwise, logical, arithmetic, etc.) that may be performed on the outputs of single FSBs and/or several FSBs. In addition to the output routing channel, the PLD may also contain at least one input routing channel that is configured to facilitate the routing, registering, and/or selection of FSB input signals. In some cases, the FSB input routing channel may also include circuitry for performing elementary processing operations.

37 Claims, 9 Drawing Sheets

OTHER PUBLICATIONS

"Xilinx Announces DSP Algorithms, Tools and Features for Virtex–II Architecture", Xilinx Inc., Nov. 21, 2000, pp. 1–4.

"Virtex–II 1.5V Field–Programmable Gate Arrays", Advance Product Specification, DS031-2 (v1.3), Xilinx Inc., Jan. 25, 2001, Module 2 of 4, pp. 1–50.

"Virtex–II 1.5V Field–Programmable Gate Arrays", Advance Product Specification, DS031-1 (v1.5), Xilinx Inc., Apr. 2, 2001, Module 1 of 4, pp. 1–7.

"Virtex–II 1.5V Field–Programmable Gate Arrays", Advance Product Specification, DS031-2 (v1.5), Xilinx Inc., Apr. 2, 2001, Module 2 of 4, pp. 1–36.

"Virtex–II 1.5V Field–Programmable Gate Arrays", Advance Product Specification, DS031-2 (v1.9), Xilinx Inc., Nov. 29, 2001, Module 2 of 4, pp. 1–39.

"Using Embedded Multipliers", Virtex–II Platform FPGA Handbook, UG002 (v1.3), Xilinx Inc., Dec. 3, 2001, pp. 251–257.

A. Chhabra and R. Iyer, "A Block Floating Point Implementation on the TMS320C54x DSP", Application Report SPRA610, Texas Instruments, Dec. 1999, pp. 1–10.

D. Bursky, "Programmable Logic Challenges Traditional ASIC SoC Designs", Electronic Design, Apr. 15, 2002, pp. 44, 46, 48.

The Applications Engineering Staff of Analog Devices, DSP Division, *Digital Signal Processing Applications Using the ADSP–2100 Family* (edited by Amy Mar), Prentice–Hall, Inc., Englewood Cliffs, NJ, Copyright 1990 by Analog Devices, Inc., Norwood, MA, pp. 141–192.

"TMS320C54x DSP Reference Set, vol. 1: CPU and Peripherals", Literature Number: SPRU131F, Texas Instruments, Apr. 1999, pp. 2–1 through 2–16 and 4–1 through 4–29.

"The QuickDSP Design Guide", Rev. B, QuickLogic Corporation, Aug. 2001, pp. 1–38.

"The QuickDSP Family Data Sheet", Rev. B, QuickLogic Corporation, Aug. 7, 2001, pp. 1–19.

\* cited by examiner

PROGRAMMABLE LOGIC DEVICE WITH ROUTING CHANNELS

BACKGROUND OF THE INVENTION

This invention relates to programmable logic devices (PLDs), and, more particularly, to techniques for facilitating the use of function-specific blocks which may be included in such devices.

As applications for which PLDs are used increase in complexity, it has become more common to design PLDs to include "function-specific blocks" (FSBs) in addition to blocks of generic programmable logic resources. Typically, an FSB is a concentration of circuitry on a PLD that has been partly- or fully-hardwired to perform one or more specific tasks, such as a logical or a mathematical operation. An FSB may also contain one or more specialized structures, such as an array of configurable memory elements. Examples of structures that are commonly implemented as FSBs include: multipliers, arithmetic logic units (ALUs), barrel-shifters, various memory elements (such as FIFO/LIFO/ SIPO/RAM/ ROM/CAM blocks and register files), AND/NAND/ OR/NOR arrays, etc., or combinations thereof.

While the availability of FSBs on a PLD may lessen the need for programmably implementing such structures in soft-logic (e.g., by piecing together and configuring several blocks of generic programmable logic resources), the nature of the functions implemented in FSBs are often those which require inputs and/or outputs that are several bits wide (i.e., multi-bit signals). As a result, significant interconnection resources may be required simply for routing input and output signals to and from FSBs. The need for interconnection resources may be further compounded when FSB output signals undergo additional processing, such as bitwise/ logical/mathematical operations, signal conditioning/ manipulation, combination with output signals from other FSBs, and the like.

As a consequence, performance and usability bottlenecks may result from the inefficient allocation of interconnection resources for the purpose of routing signals to and from FSBs. Such performance bottlenecks may become acute in those PLD designs wherein the routing needs of the FSBs are accommodated primarily by diverting existing routing resources from the structures that surround the FSBs (e.g., blocks of generic programmable logic resources), such that the inefficient usage of those routing resources may sacrifice the usability of the neighboring structures.

SUMMARY OF THE INVENTION

The present invention relates to PLDs wherein dedicated output routing channels are provided to facilitate the processing of output signals generated by one or more FSBs while allowing general-purpose interconnection resources to be conserved.

A dedicated output routing channel that may be constructed in accordance with the principles of the present invention includes a plurality of selectively-chainable functional units that are programmably configurable to implement, in a relatively localized area, a variety of processing operations (e.g., bitwise/ logical/mathematical functions, combinations, etc.) that may be performed on the output signals generated by one or more FSBs.

In addition, dedicated input routing channels may also be provided to facilitate the routing, registering, and/or selection of the input signals supplied to the FSBs. In some cases, the dedicated input routing channels may also contain circuitry for performing elementary processing operations (e.g., various arithmetic, logical, and/or signal conditioning operations, etc.) on the signals to be supplied as inputs to the FSBs.

Further features of the invention, its nature, and various advantages, will be more apparent from the accompanying drawings and the following detailed description of the invention.

BRIEF DESCRIPTION OF THE DRAWINGS

FIG. 5a is a simplified block diagram that illustrates in greater detail an aspect of the portion shown in FIG. 1a.

DETAILED DESCRIPTION OF THE INVENTION

Figure 1A:
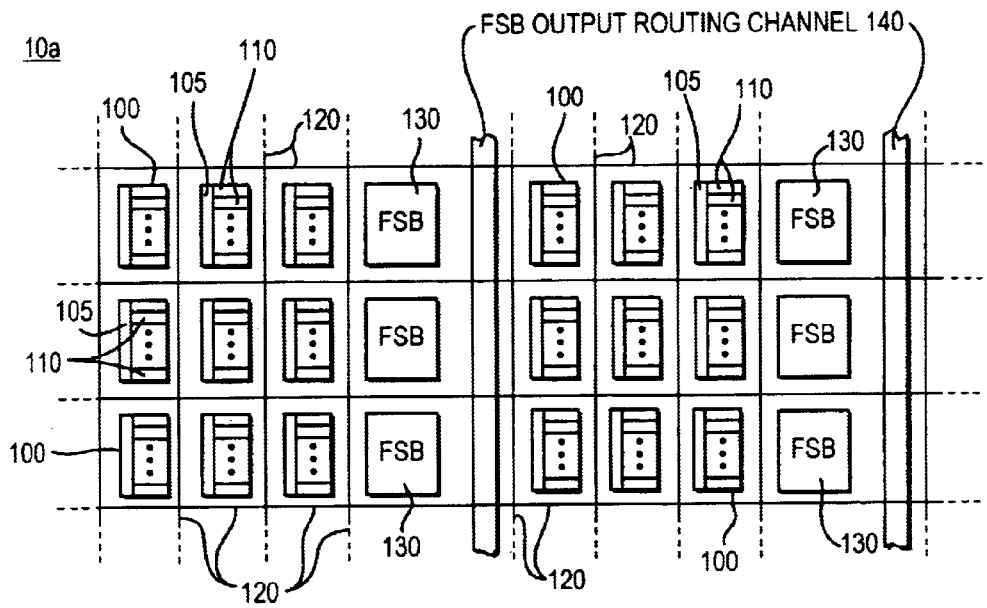
FIG. 1a is a simplified block diagram of a portion of a PLD that may be constructed in accordance with the principles of the present invention.

FIG. 1a shows, in highly simplified form, a portion of a PLD 10a. PLD 10a may include blocks of generic programmable logic resources 100, which may be any of a variety of types of logic (e.g., product-term/ sum-of-products, lookup-table, etc.). Each block of generic programmable logic resources 100 may include several smaller regions of programmable logic 110 and intra-block interconnection resources 105 for conveying signals amongst such regions 110.

Figure 2:
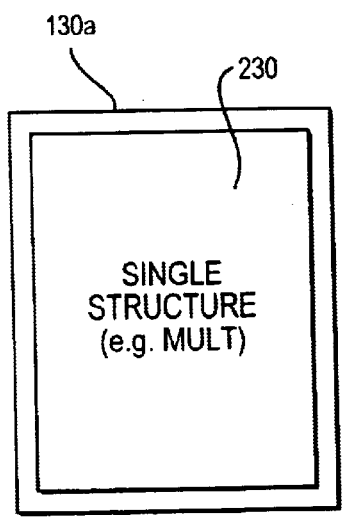
FIG. 2 is a simplified block diagram of one possible embodiment of a structure included within the portion shown in any of FIGS. 1a–1c.
Figure 3:
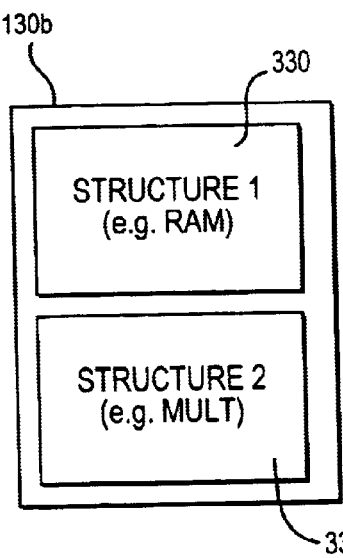
FIG. 3 is a simplified block diagram of an alternative embodiment of the structure shown in FIG. 2.
Figure 4:
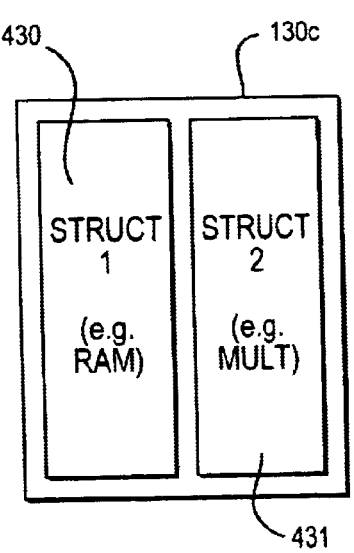
FIG. 4 is a simplified block diagram of another alternative embodiment of the structure shown in FIG. 2.

In addition to the blocks of generic programmable logic resources 100, PLD 10a may also include a plurality of FSBs 130, wherein each FSB 130 may be a concentration of circuitry that has been partly- or fully-hardwired to perform one or more specific operations (e.g., bitwise/logical/ mathematical functions, combination/manipulation/ conditioning of signals, etc.), and/or to implement one or more specialized structures (e.g., configurable memory elements, etc.). Examples of FSBs include: multipliers, ALUs, barrel-shifters, various memory elements (such as FIFO/LIFO/SIPO/RAM/ROM/CAM blocks and register files), AND/NAND/OR/NOR arrays, etc., or combinations thereof. An FSB 130 may be designed to perform a single specialized operation or function, such as the FSB 130a shown in FIG. 2, which contains a single function-specific structure (e.g., multiplier 230). Alternatively, an individual FSB 130 may be designed to include multiple function-specific structures. For example, FIG. 3 shows an FSB 130b that contains two function-specific structures: a RAM block 330 and a multiplier 331. The arrangement of multiple function-specific structures within an FSB 130 is by no means limited to that shown in FIG. 3; for example, FIG. 4 shows an FSB 130c, in which the function-specific structures contained therein (i.e., RAM block 430 and multiplier 431) are arranged to be horizontally adjacent. In short, for the purposes of the present invention, an FSB 130 may be any grouping of partly- or fully-hardwired structures that are configured to perform one or more specialized functions.

Returning to FIG. 1a, PLD 10a may also include general interconnection resources 120 for conveying signals throughout PLD 10a. In order to avoid over-complicating FIG. 1a, general interconnection resources 120 are shown as single lines, each of which may be representative of an interconnection structure that may include multiple conductors of different types and lengths, as well as a variety of structures that are programmably selectively configurable for routing signals throughout PLD 10a, such as: global interconnection conductors that span entire rows and columns of blocks of generic programmable logic resources 100; local/intermediate interconnection conductors that span a portion of a row or column; programmable switches that are configurable to selectively allow connections amongst the various global/intermediate/local interconnection conductors and the other structures on PLD 10a (e.g., blocks of generic programmable logic resources 100, FSBs 130, input/ output circuitry, etc.); and buffers/drivers, some of which may be tristatable, unidirectional, bidirectional, etc.

Despite the variety and flexibility of general interconnection resources 120 for routing signals throughout PLD 10a, substantial interconnection resources may, in some cases, still be required to effectively accommodate the routing needs of FSBs 130 in various processing operations (e.g., bitwise/logical/mathematical operations, signal conditioning/manipulation, combination with output signals from other FSBs, etc.). In some PLD designs, the routing needs of FSBs are met primarily by diverting or sharing existing routing resources associated with the structures surrounding the FSBs (e.g., blocks of generic programmable logic resources), and piecing together those routing resources as needed. However, depending on the application, it may be difficult to avoid performance bottlenecks that may arise out of such sharing arrangements: where routing resources are heavily shared between FSBs and their neighboring structures, the usability of those neighboring structures may be reduced or even sacrificed when the PLD is configured to heavily use its FSBs. In a PLD 10a that has been constructed in accordance with the principles of the present invention, such performance bottlenecks may be avoided (or, at least, have their effects mitigated) through the inclusion of a dedicated FSB output routing channel 140 that is configured to facilitate the processing, manipulation, and combination of FSB output signals, thereby alleviating the stress on the general interconnection resources 120.

Figure 1B:
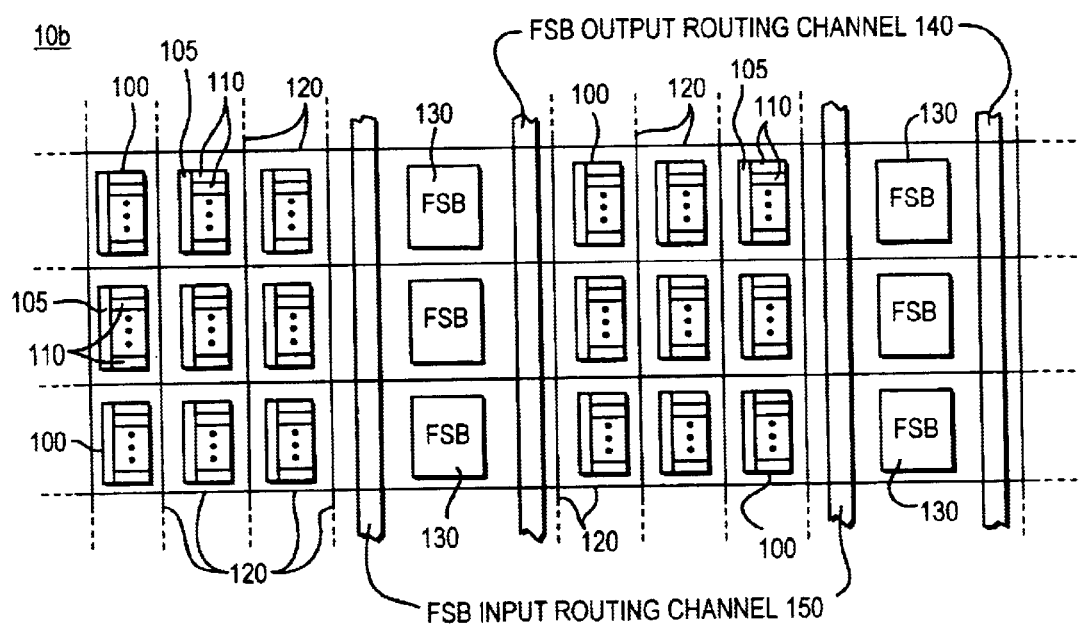
FIG. 1b is a simplified block diagram of a portion of another PLD that may be constructed in accordance with the principles of the present invention.

In some cases, it may be possible to further reduce the stress on the general interconnection resources 120 by additionally providing dedicated routing channels, or similar structures, for the input signals of the FSBs 130. For example, FIG. 1b shows a portion of a PLD 10b, wherein each column of FSBs 130 has an FSB input routing channel 150, in addition to the FSB output routing channel 140 described above. As a design alternative to PLD 10a, wherein the routing and logic functions involved in properly handling signals destined for FSB inputs may be implemented in soft-logic (e.g., by configuring neighboring generic programmable logic resources 100 and/or general interconnection resources 120), PLD 10b includes FSB input routing channels 150 which may be configured to facilitate the routing, registering, and/or selection of multi-bit signals that are being supplied to the FSBs 130 as input signals. In other possible implementations, FSB input routing channel 150 may also include circuitry that may be configured to selectively perform elementary processing operations (e.g., various arithmetic, logical, signal conditioning functions, etc.) on signals destined for application as inputs to the FSBs 130. Depending on the specific implementation of FSB input routing channel 150, it may be structurally similar to the FSB output routing channel 140. Alternatively, FSB input routing channel 150 may share few, if any, structural similarities with FSB output routing channel 140, and may instead be highly customized to accommodate the requirements of a specific application.

Figure 1C:
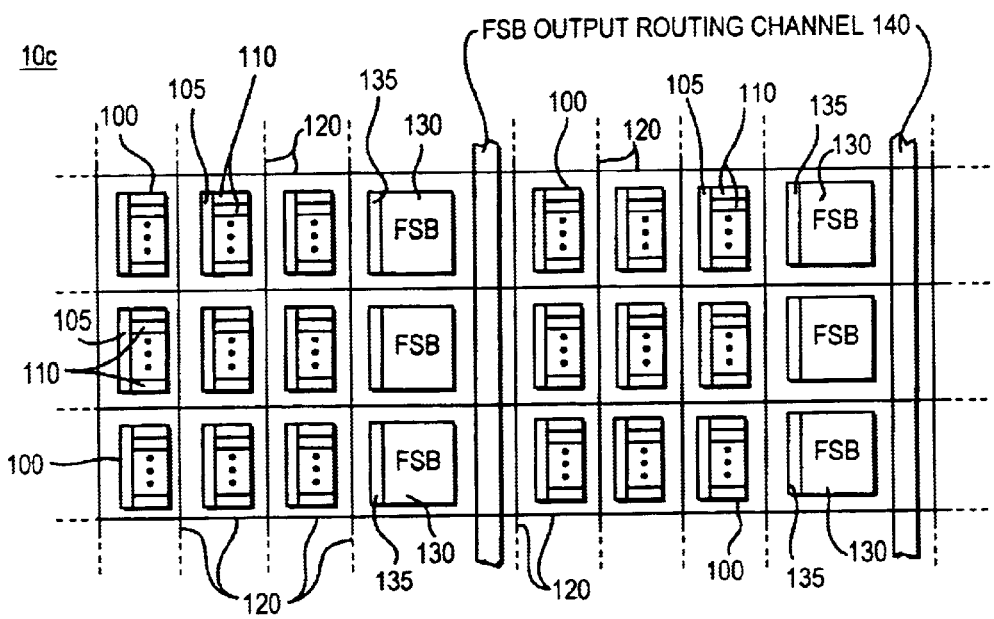
FIG. 1c is a simplified block diagram of a portion of yet another PLD that may be constructed in accordance with the principles of the present invention.

Rather than being implemented as a separate structure, FSB input routing channel 150 may alternatively be implemented as part of the FSBs 130. For example, FIG. 1c shows a portion of a PLD 10c, in which each FSB 130 in a column of FSBs 130 includes input circuitry 135 that may contain structures that are similar to those found in the FSB input routing channel 150 of PLD 10b.

Figure 5A:
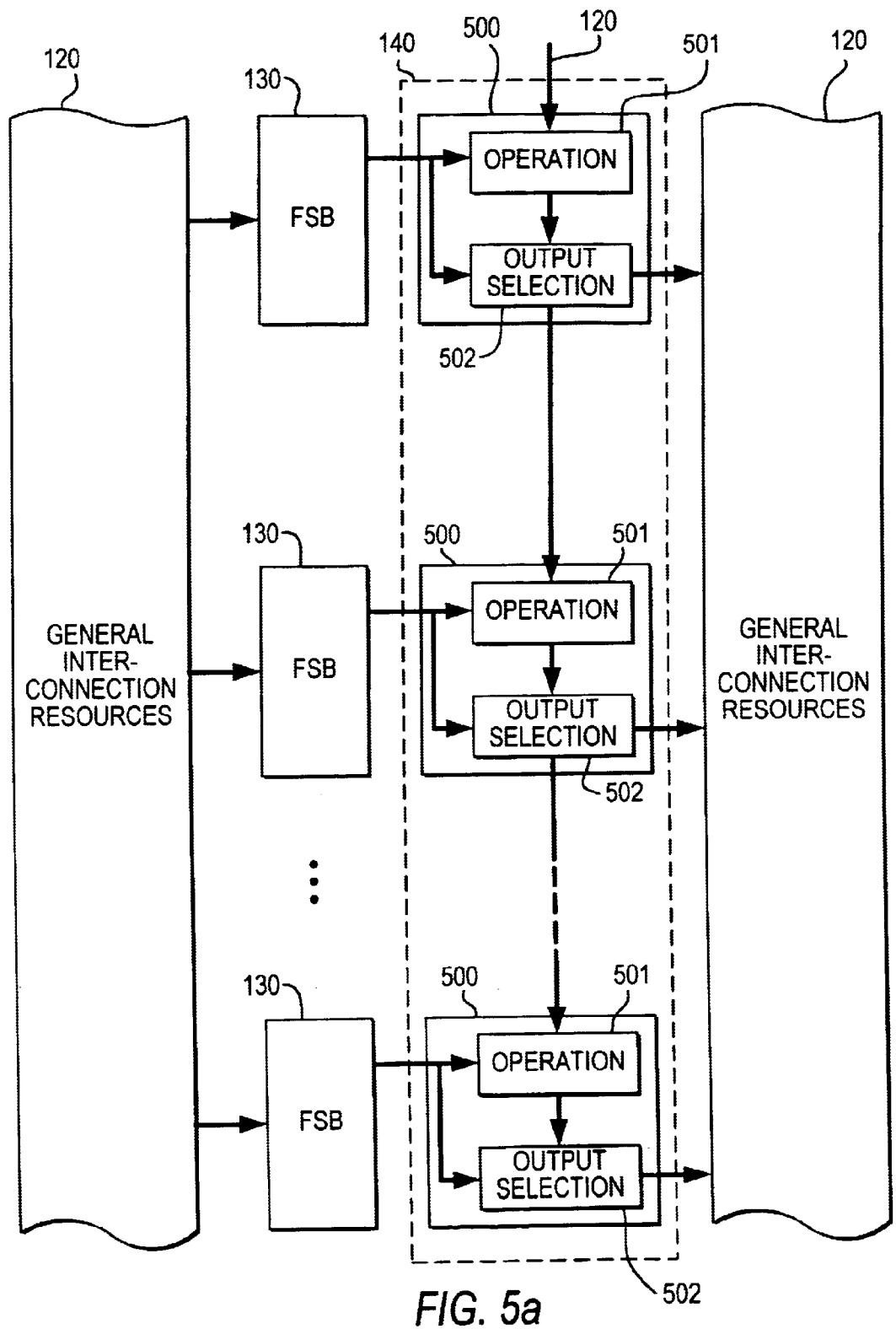

Returning to the discussion of FSB output routing channel 140, FIG. 5a is a schematic block diagram of a section of PLD 10a that highlights the various structural interrelationships in and around FSB output routing channel 140 in greater detail. As shown in FIG. 5a, FSB output routing channel 140 is provided near a plurality of FSBs 130 so as to allow the output signals generated by those FSBs 130 to be efficiently processed locally within a relatively small area. For example, in the arrangement illustrated in FIG. 5a, FSB output routing channel 140 may run continuously adjacent to a column of FSBs 130. In other arrangements, FSB output routing channel 140 may be spaced apart from its associated column of FSBs 130 by at least one column of another circuit structure (e.g., blocks of generic programmable logic resources 100, another column of FSBs 130, etc.) and/or may span only a portion of a column of FSBs 130. Where the FSBs 130 are arranged along a row, the foregoing description relating to the arrangement of the FSB output routing channel 140 in relation to a column of FSBs 130 may be analogously applicable. In yet another arrangement, the FSBs 130 may be arranged in several columns (or rows) to form a two-dimensional array of FSBs, and an FSB output routing channel 140 may then be provided between the columns of FSBs 130 and/or around the periphery of the array of FSBs 130 in a closed or partial loop. In order to simplify the illustration of the principles of the present invention, however, the ensuing discussion of FSB output routing channel 140 will focus on the specific arrangement shown in FIG. 5*a*.

As illustrated in FIG. 5a, FSB output routing channel 140 may contain routing, selection, and functional structures that are programmably selectively configurable to facilitate the performance of various processing operations on the output signals generated by an adjacent column of FSBs 130. By localizing the processing of the output signals generated by FSBs 130, FSB output routing channel 140 may help decrease latency (e.g., in pipelined or registered systems) and/or delay (e.g., in non-pipelined or unregistered systems) in the processing operation being performed. In addition, congestion on the general interconnection resources 120 may be reduced since the use of FSB output routing channel 140 could lessen the need for complex soft-logic implementations of various processing operations that would involve configuring and piecing together several blocks of generic programmable logic resources 100, and routing signals to, from, and between those blocks of generic programmable logic resources 100.

The processing within FSB output routing channel 140 may be accomplished by a plurality of functional units 500, to which the output signals generated by the FSBs 130 are made available. In the illustrative arrangement shown in FIG. 5*a*, each FSB 130 is associated with a respective one of the functional units 500. In other arrangements, the number of functional units 500 contained within a given FSB output routing channel 140 may be different from the number of FSBs 130 spanned by the FSB output routing channel 140: depending on the implementation, fewer functional units 500 may be spread out over the FSB output routing channel 140, or they may be concentrated near a particular group of FSBs 130.

Each functional unit 500 contains an operational block 501 which may be a concentration of circuitry that is programmably configurable to perform one or more elementary processing operations (e.g., various arithmetic/logical functions, shifting, signal conditioning operations, etc.) on one or more FSB output signals. Each operational block 501 may be implemented as a programmable structure that is reconfigurable in soft-logic or, alternatively, it may be a partly- or fully-hardwired structure. The types of operations which may be suitable for implementation in a given operational block 501 include those operations (e.g., adders, shifters, etc.) which, in conventional designs, would have typically been implemented by piecing together and configuring several blocks of generic programmable logic resources. By providing operational blocks 501 in FSB output routing channel 140, the need for piecing together several blocks of generic programmable logic resources 100 and using the general interconnection resources 120 to route signals to, from, and amongst such blocks may be substantially reduced, thereby freeing up more of those resources for other uses while decreasing latency and/or delay.

In addition to operational block 501, each functional unit 500 may also include output selection logic 502, which may be programmably configurable to pass either the output of its associated FSB 130 (i.e., bypassing the operational block 501) or the output of its associated operational block 501 for selective application to the general interconnection resources 120 and/or to an operational block 501 within a neighboring functional unit 500. The output selection logic 502 may be further programmably configurable to pass such signals in registered or unregistered form.

By programmably conveying signals selected by the output selection logic 502 in one functional unit 500 to an operational block 501 in a neighboring functional unit 500, the functional units 500 may be selectively programmably chained or concatenated so as to facilitate the implementation of various complex processing operations on signals generated by one or more FSBs 130. Within FSB output routing channel 140, the number of functional units 500 that may be programmably selectively chained at one time depends on the specific processing task to be performed. For example, in one configuration of FSB output routing channel 140, none of the functional units 500 would be chained; in another configuration, all of the functional units 500 would be chained together in order to perform a complex operation that involves the output signals generated by all of the FSBs 130 in the adjacent column; or, in still another configuration, only a subset of the functional units 500 would be chained while the remaining functional units 500 would not be chained. In this manner, the ability to programmably selectively use several functional units 500 in the aggregate allows complex processing tasks to be implemented within a relatively small chip area such as FSB output routing channel 140, thereby allowing general interconnection resources 120 to be conserved.

Figure 5B:
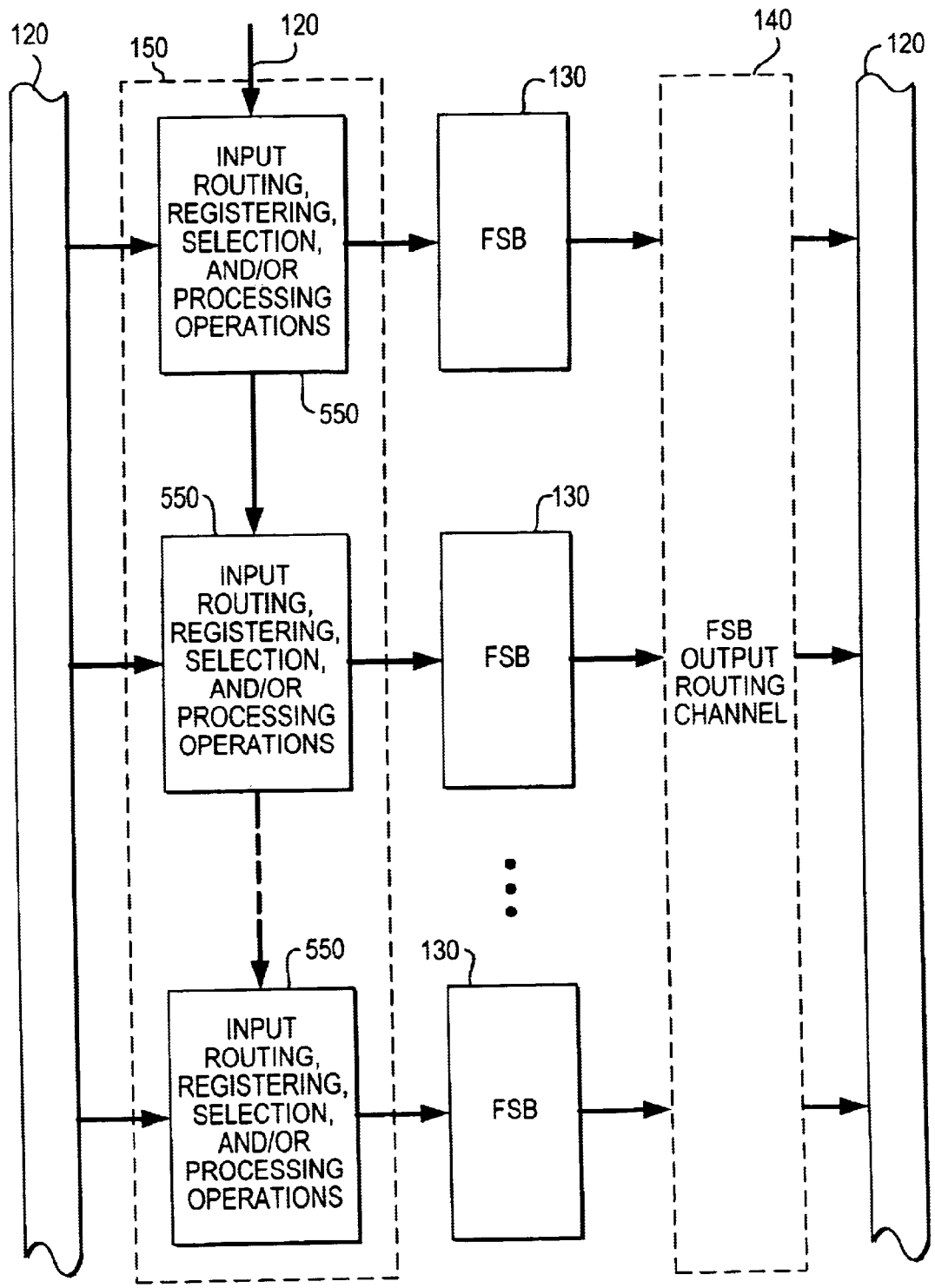
FIG. 5b is a simplified block diagram that illustrates in greater detail an aspect of the portion shown in FIG. 1b.

As mentioned previously, in addition to the use of FSB output routing channel 140, the inclusion of FSB input routing channels 150 may, in some cases, further reduce the congestion on the general interconnection resources 120. FIG. 5*b* is a schematic block diagram of a section of PLD 10*b* that highlights the various structural interrelationships in and around FSB input routing channel 150 in greater detail. As shown in FIG. 5*b*, FSB input routing channel 150 may run adjacent to a column of FSBs 130; however, as in the case of FSB output routing channel 140, the specific orientation/arrangement of FSB input routing channel 150 with respect to a plurality of FSBs 130 is not limited to that shown in FIG. 5*b*. The various alternative orientations/arrangements mentioned above for FSB output routing channel 140 may, in some cases, be suitably adapted for FSB input routing channel 150.

As illustrated in FIG. 5*b*, FSB input routing channel 150 contains a plurality of input processing blocks 550 that may contain any of a variety of routing, registering, and/or selection logic. In addition, each input processing block 550 may also contain circuitry that may be configured to perform elementary processing operations (e.g., various arithmetic/logical functions, shifting, signal conditioning, etc.) on signals destined for application as inputs to the FSBs 130. Each input processing block 550 is configured to accept from the general interconnection resources 120 one or more input signals destined for an associated FSB 130. Possible operations performed by an input processing block 550 may include: passing or buffering input signals, selectively registering signals, selecting between several possible input signals, arithmetic operations (e.g., addition/subtraction of a plurality of signals to generate a single FSB input signal), signal conditioning functions (e.g., negation, rounding, etc.), logically combining a plurality of input signals (e.g., AND-ing a plurality of signals), etc. In addition, signals may be programmably selectively passed from one input processing block 550 to another. The FSB input routing channel 150 may also include common routing resources that may partly or fully span the FSB input routing channel 150, and which may be used by some or all of the input processing blocks 550 therein. In a manner similar to that of FSB output routing channel 140, FSB input routing channel 150 allows FSB input signals to be processed in an arrangement that lessens the need for complex soft-logic implementations of the various processing operations that may be used on input signals.

Figure 5C:
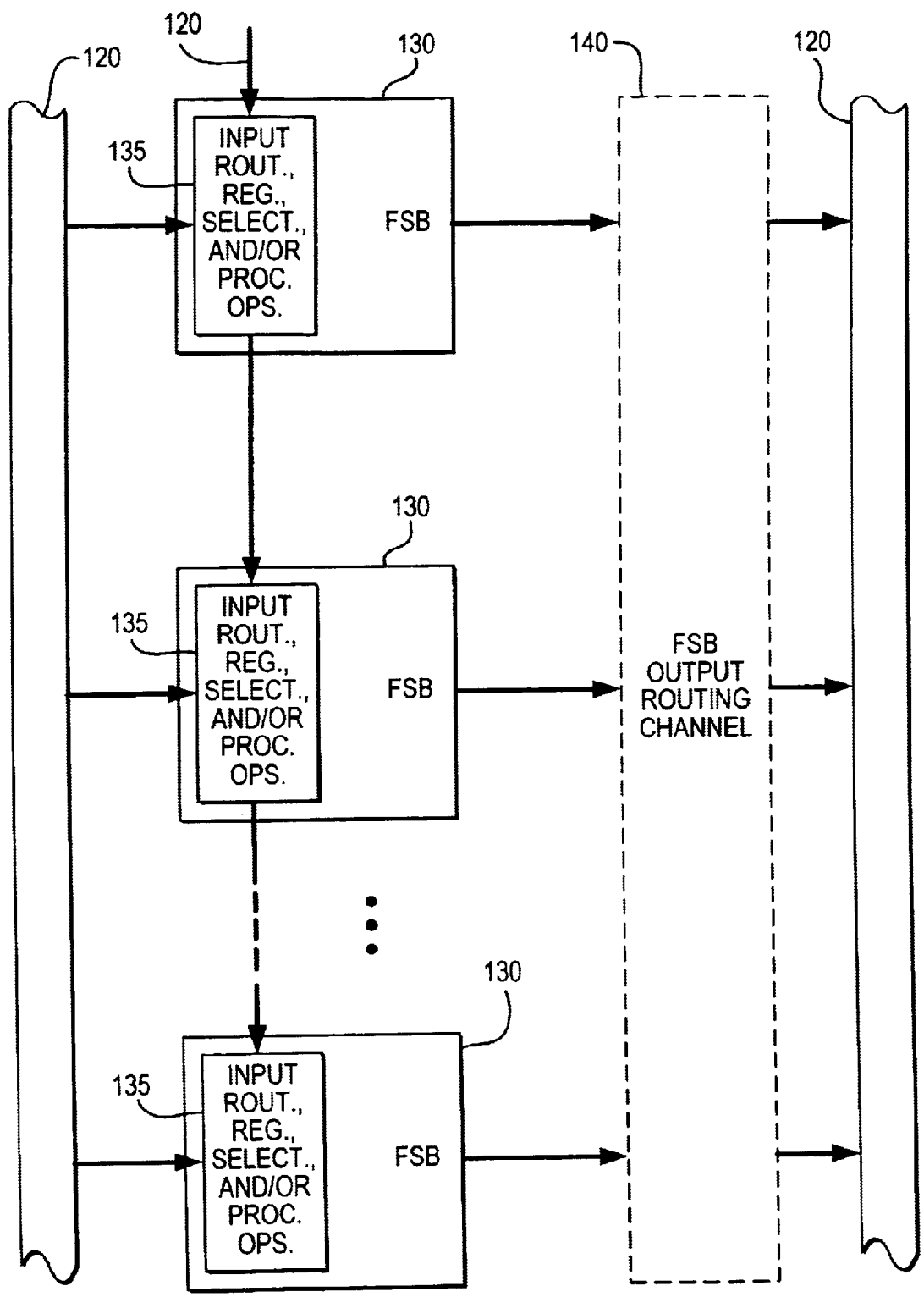
FIG. 5c is a simplified block diagram that illustrates in greater detail an aspect of the portion shown in FIG. 1c.

As an alternative to the inclusion of an FSB input routing channel 150 as a separate structure, FIG. 5c shows how each FSB 130 may contain input circuitry 135, which may be similar to an input processing block 550 within FSB input routing channel 150. In an arrangement similar to that of FSB input routing channel 150, the respective input circuitry 135 within each FSB 130 may be able to pass signals to or receive signals from the input circuitry 135 within a neighboring FSB 130. In addition, common routing resources may be provided for use by the associated input circuitry 135 within the FSBs 130, wherein the common routing resources may partly or fully span the column of FSBs 130.

Figure 6:
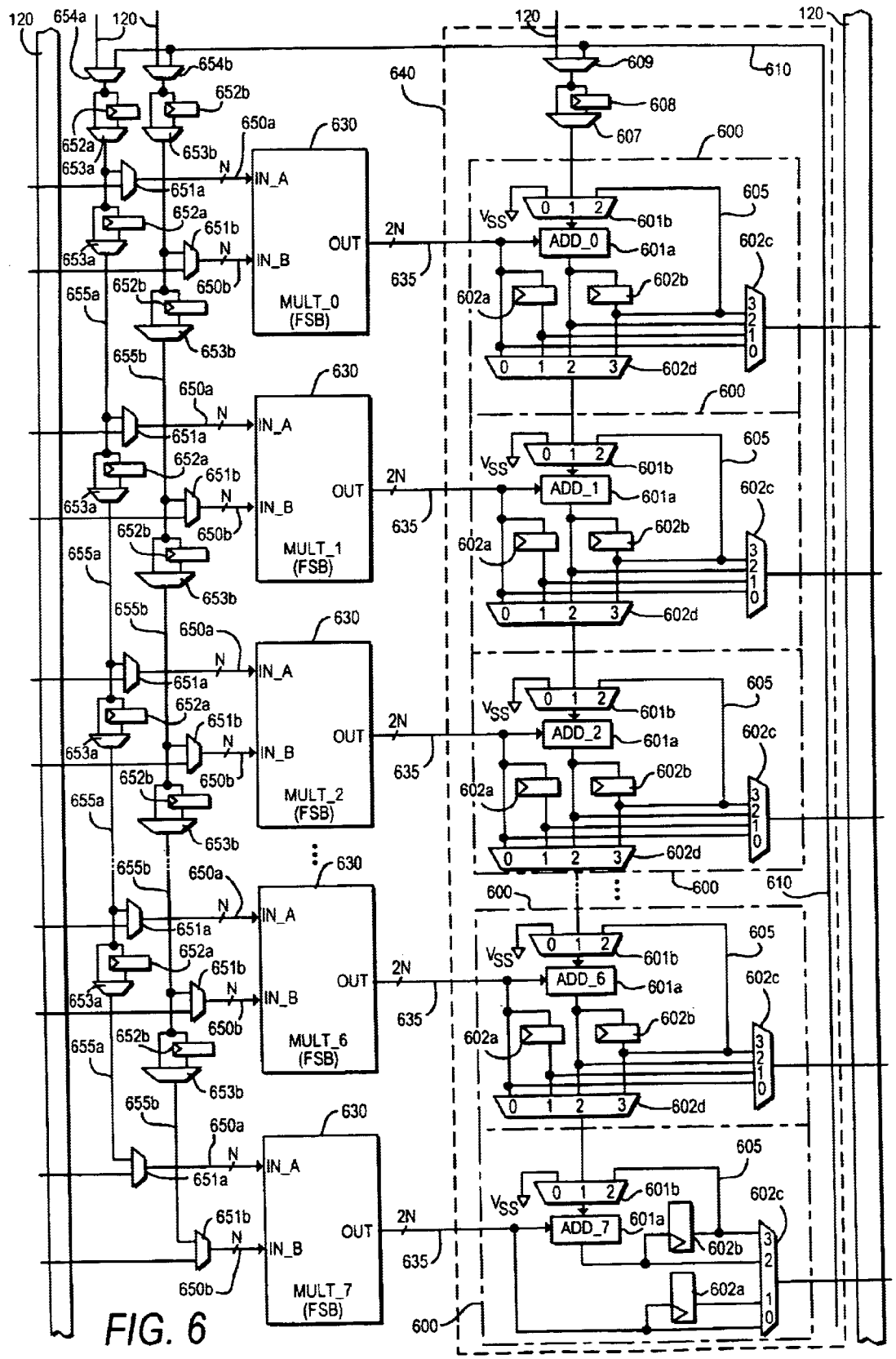
FIG. 6 is a simplified block diagram that illustrates one possible implementation of the arrangement shown in any of FIGS. 5a–5c in the context of a digital signal processing (DSP) application.

In order to further illustrate how FSB output routing channel 140 may facilitate the processing of FSB output signals in accordance with the principles of the present invention, FIG. 6 illustrates one possible implementation of the arrangement shown in any of FIGS. 5a–5c in the context of a DSP application. A common set of calculations performed in DSP applications involves the multiplication of multi-bit signals (i.e., signals that are several bits wide) and the subsequent accumulation and/or addition of the results. Thus, in the arrangement featured in FIG. 6, the FSBs are multipliers 630 and the FSB output routing channel 640 contains structures which may be programmably selectively configurable to accommodate commonly-occurring operations that involve the processing of the output signals generated by those multipliers 630. Although the ensuing discussion of FIG. 6 will focus on the specific case of DSP applications, the principles illustrated herein may be readily adapted for use in other applications (e.g., data conversion, control systems, etc.) that may use other types of FSBs.

In the arrangement illustrated in FIG. 6, the FSBs of interest are featured as a column of eight multipliers 630, labeled MULT_0 through MULT_7. Each multiplier 630 is configured to multiply a pair of N-bit input signals, IN_A and IN_B, to generate a 2N-bit output signal that is then made available on output bus 635. Depending on the application, multiplier 630 may be configured to perform signed multiplication, unsigned multiplication, or both. In addition, the bit-length of its input signals, IN_A and IN_B, may each be different. However, in order to simplify the illustration of the principles of the invention, the discussion of FIG. 6 will focus on the case where the input signals, IN_A and IN_B, are both N-bit-wide unsigned values. In addition, in order to avoid over-complicating FIG. 6, many of the single lines and other single structures illustrated therein may be representative of a plurality of such lines and structures that are configured to handle signals that are several bits wide. Furthermore, it will be understood that the structures shown on the input side of the multipliers 630 (e.g., the routing, registering, and selection circuitry) may be implemented either (1) in soft-logic, as in PLD 10a, (2) with an FSB input routing channel 150, as in PLD 10b, (3) as the input circuitry 135 contained within the FSBs 130, as in PLD 10c, or (4) any combination of these arrangements.

Each of the N-bit input signals, IN_A and IN_B, to multiplier 630 is provided on an associated input bus 650a/b, which may be connected to a programmable logic connector (PLC) 651a/b that allows signals from the general interconnection resources 120 to be programmably selectively provided as inputs to the associated multiplier 630. In some arrangements, such as the one shown in FIG. 6, one of the selectable inputs provided to PLC 651a/b may be conveyed on a common input bus 655a/b, on which an input signal may be provided to more than one multiplier 630. The signals present on common input bus 655a/b, which may also be programmably selectively registered by the operation of register 652a/b and PLC 653a/b, may be derived from the general interconnection resources 120 and/or from other sources (e.g., structures within the vicinity of the column of multipliers 630, other types of routing resources, etc.). For example, as shown in FIG. 6, the output signals of FSB output routing channel 640 may be conveyed via feedback bus 610 to PLC 654a/b, which is configured to programmably select signals for application on the common input bus 655a/b. Feedback bus 610 may be implemented in hard-logic, soft-logic, or a combination thereof.

Turning now to a description of the structures on the output side of the column of multipliers 630, FIG. 6 shows one arrangement of an FSB output routing channel 640 that may be suitable for processing the output signals generated by those multipliers 630 to which it runs adjacent. FSB output routing channel 640 contains eight functional units 600 that are programmably selectively configurable for performing common operations that occur in DSP applications, such as accumulating or combining the outputs of one or more multipliers by one or more adders. Accordingly, in the exemplary arrangement shown in FIG. 6, each functional unit 600 contains an operational block that includes a two-input adder 601a. Each adder 601a has an associated PLC 601b, which allows either zero (e.g., $V_{ss}$), the output of a neighboring functional unit 600, or the registered output of the adder 601a itself (conveyed on feedback path 605) to be programmably selectively applied as an input. The other input to adder 601a is provided via multiplier output bus 635, on which an output signal generated by an associated multiplier 630 is applied. The output of adder 601a is therefore the sum of the signal present on multiplier output bus 635 and the signal selected by PLC 601b.

Each functional unit 600 also contains output selection logic: depending on the configuration of PLCs 602c/d, the output of the multiplier 630 present on multiplier output bus 635 and/or the output of adder 601a may be programmably selectively provided to the general interconnection resources 120, to the feedback bus 610, and/or to a neighboring functional unit 600 (as an input signal to PLC 601b). The output selection logic may also include registers 602a/b, wherein, depending on how PLCs 602c/d are configured, the signals being programmably selectively passed may be registered or unregistered.

In the specific arrangement shown in FIG. 6, the inputs and the outputs of neighboring functional units 600 may be programmably selectively chained. As a result, it is possible to perform within FSB output routing channel 640 a variety of complex processing operations that involve the aggregated processing of the output signals generated by several multipliers 630. Examples of the various processing operations that may be accomplished by appropriately configuring the functional units 600 within FSB output routing channel 640 are featured in FIGS. 7–10.

Figure 7:
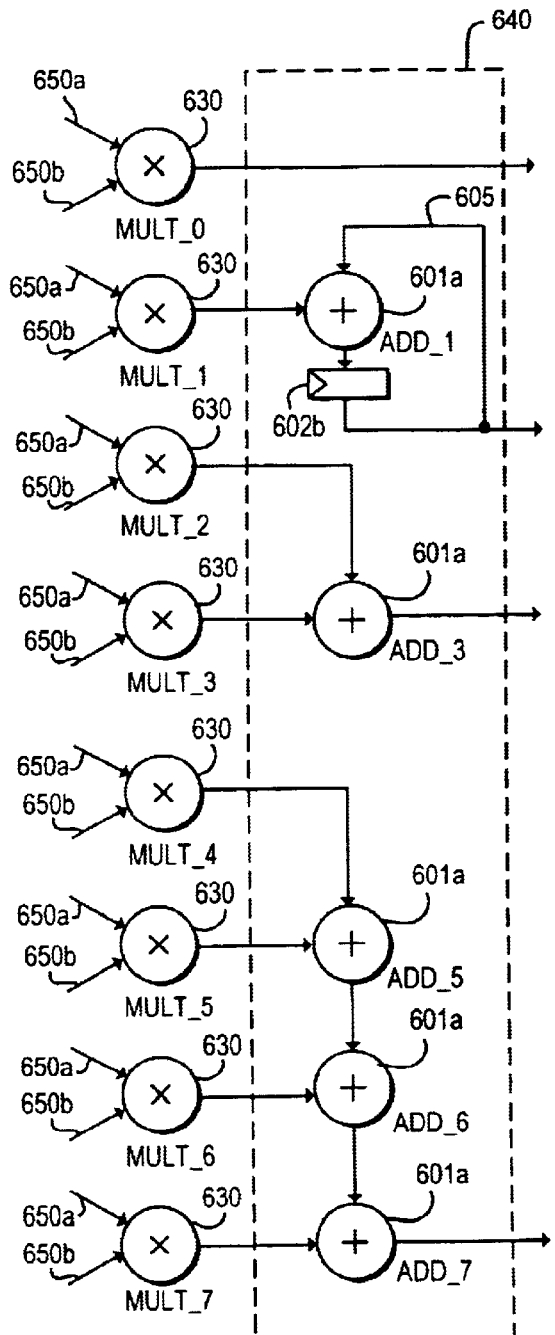
FIG. 7 is a simplified block diagram that illustrates one possible configuration of the structures shown in FIG. 6.

FIG. 7 provides an example of how different types of operations of varying levels of complexity may be concurrently performed within a single FSB output routing channel 640. The first multiplier 630, MULT_0, illustrates how the output of a multiplier 630 may be applied directly to the general interconnection resources 120 via the FSB output routing channel 640: the functional unit 600 associated with MULT_0 is configured so that "0" is selected on PLC 602c. The second multiplier 630, MULT_1, is configured to form a multiplier-accumulator with its associated functional unit 600: the functional unit 600 associated with MULT_1 is configured so that "2" is selected on PLC 601b (in order to feed back the output of ADD_1), and "3" is selected on PLC 602c in order to make the output of the multiplier-accumulator available for application on the general interconnection resources 120. The next two multipliers 630, MULT_2 and MULT_3, illustrate how the output signals generated by a pair of multipliers 630 may be added together: the functional unit 600 associated with MULT_2 is configured so that "0" is selected on PLC 602d, and the functional unit 600 associated with MULT_3 is configured so that "1" is selected on PLC 601b and "2" is selected on PLC 602c. The remaining multipliers 630, MULT_4 through MULT_7, show how their respective outputs may all be added together in an adder chain: the functional unit 600 associated with MULT_4 is configured so that "0" is selected on PLC 602d, each of the functional units 600 associated with MULT_5 and MULT_6 is configured so that "1" is selected on PLC 601b and "2" is selected on PLC 602d, and the functional unit 600 associated with MULT_7 is configured so that "1" is selected on PLC 601b and "2" is selected on PLC 602c.

Figure 8:
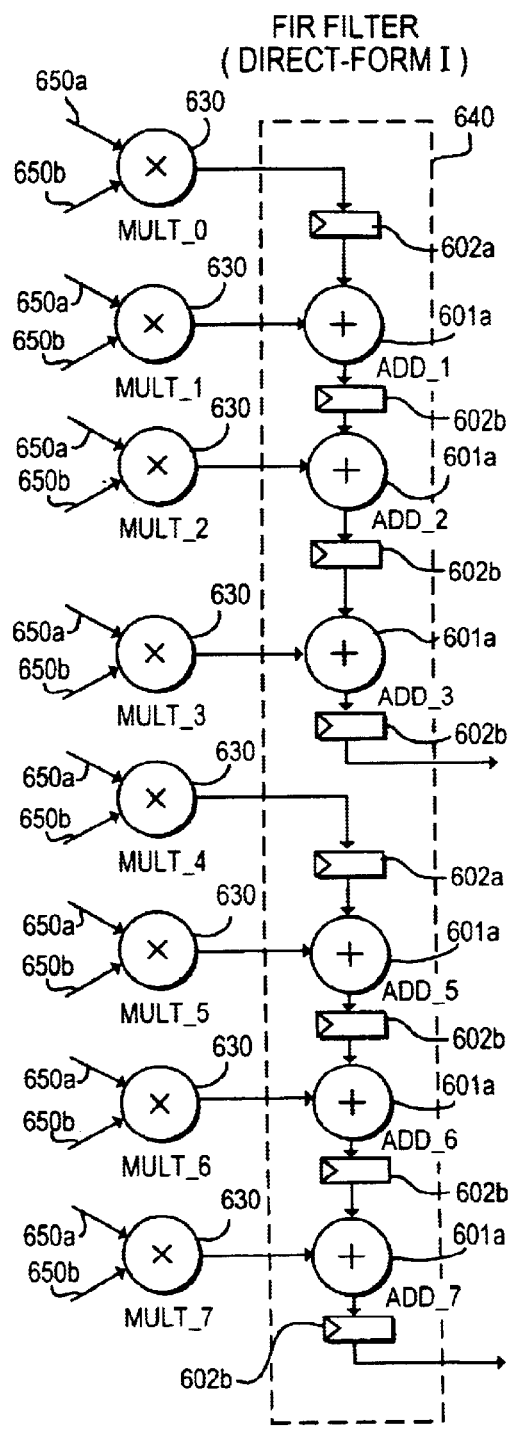
FIG. 8 is a simplified block diagram that illustrates another possible configuration of the structures shown in FIG. 6.

FIG. 8 provides an illustration of how two 4-tap Direct-Form I Finite Impulse Response (FIR) filters may be implemented by the structures shown in FIG. 6. The first FIR filter uses MULT_0 through MULT_3 and the top half of FSB output routing channel 640, whereas the second FIR filter uses MULT_4 through MULT_7 and the bottom half of FSB output routing channel 640. The implementation of the first FIR filter may be accomplished by configuring the respective functional units 600 associated with MULT_0 through MULT_3 as follows: the functional unit 600 associated with MULT_0 is configured such that "1" is selected on PLC 602d; the respective functional units 600 associated with MULT_1 and MULT_2 are each configured such that "1" is selected on PLC 601b and "3" is selected on PLC 602d; and the functional unit 600 associated with MULT_3 is configured such that "1" is selected on PLC 601b and "3" is selected on PLC 602c. The second FIR filter may be implemented by configuring the functional units 600 associated with MULT_4 through MULT_7 in a manner similar to that of MULT_0 through MULT_3. Alternatively, the two FIR filters may be chained so as to produce a single 8-tap FIR filter by configuring the functional unit 600 associated with MULT_3 so that "3" is selected on PLC 602d, and by configuring the functional unit 600 associated with MULT_4 so that "1" is selected on PLC 601b and "3" is selected on PLC 602d.

Figures 9, 10:
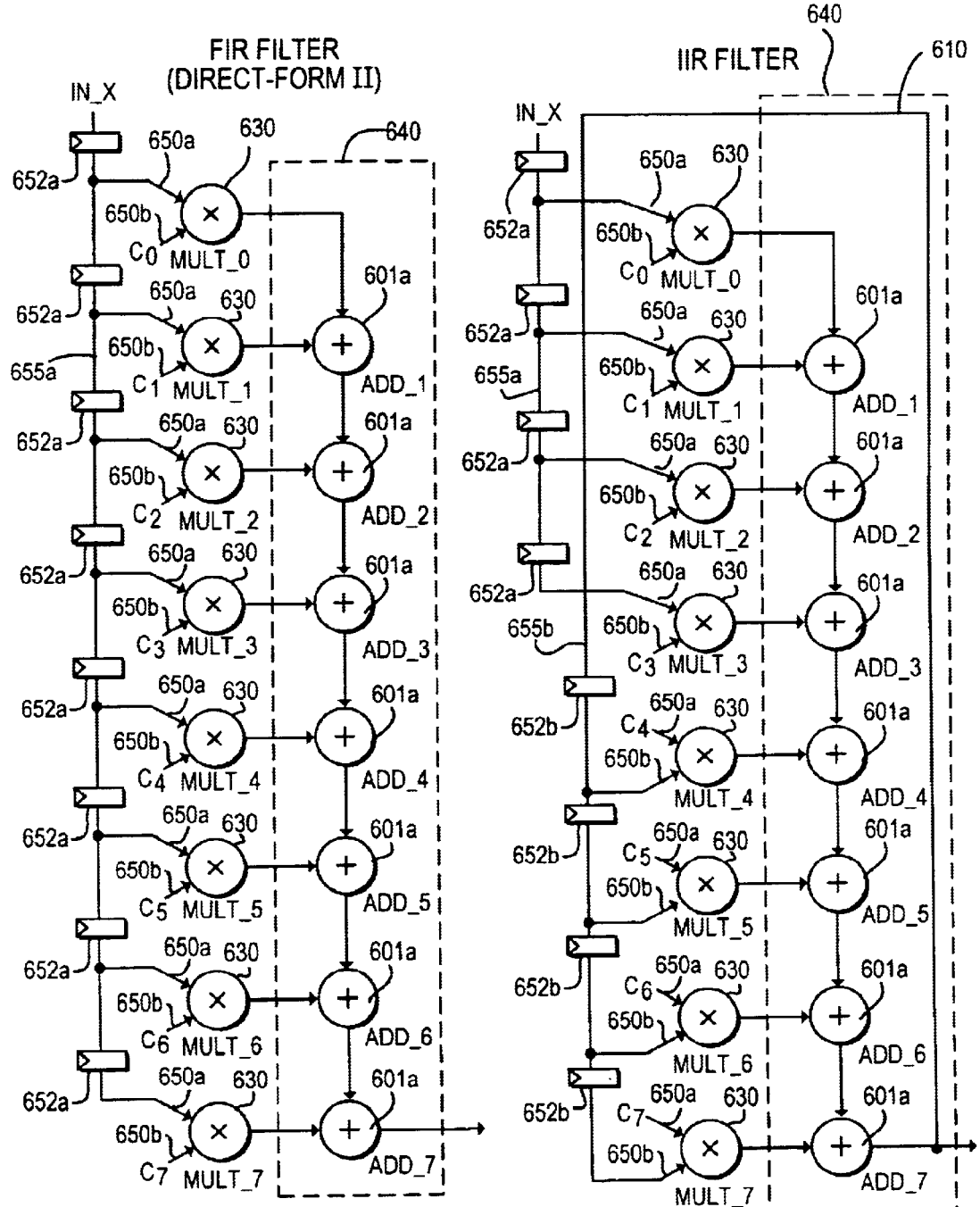
FIG. 9 is a simplified block diagram that illustrates still another possible configuration of the structures shown in FIG. 6.
FIG. 10 is a simplified block diagram that illustrates yet another possible configuration of the structures shown in FIG. 6.

Expanding on the adder chain configuration shown in FIG. 7, FIG. 9 shows how an 8-tap Direct-Form II FIR filter may be constructed. In this implementation, the common input bus 655a and its associated input registers 652a (which are shown in FIG. 6 on the input side of the column of multipliers 630) are used to supply a registered input signal, IN_X, to the multipliers 630. Summation of the results of all of the multipliers 630 may then be accomplished with an adder chain implemented within FSB output routing channel 640.

Similarly, FIG. 10 shows how an IIR filter may be implemented by the structures shown in FIG. 6. For the first four multipliers 630, MULT_0 through MULT_3, the associated common input bus 655a and the associated input registers 652a supply a registered input signal, IN_X. For the remaining four multipliers 630, MULT_4 through MULT_7, the input signal provided by the associated common input bus 655b, which is registered through input registers 652b, is the output signal of the IIR filter that is conveyed by feedback bus 610. To produce the output of the IIR filter, the results of all of the multipliers 630 may be added together in an adder chain implemented within FSB output routing channel 640.

Figure 11:
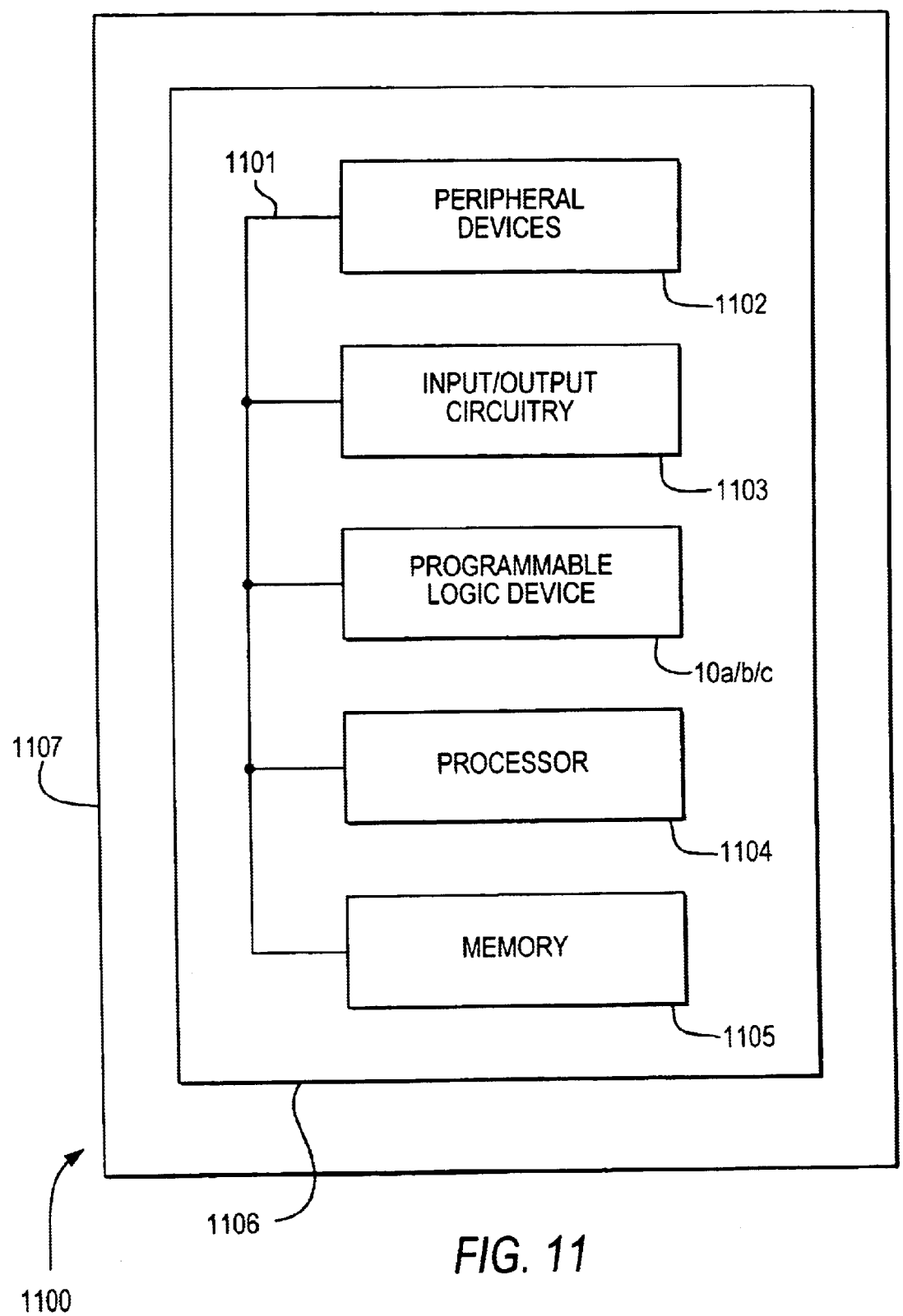
FIG. 11 is a simplified block diagram of an illustrative system employing a PLD that has been improved in accordance with the principles of the present invention.

FIG. 11 shows how PLD 10a/b/c, which includes the above-described FSB output routing channel 140/640 (and, in some cases, FSB input routing channel 150 as well), may be used in a data processing system 1100. Data processing system 1100 may include one or more of the following components: peripheral devices 1102, input/output circuitry 1103, a processor 1104; and a memory 1105. These components may be coupled together by a system bus 1101 and may be populated on a printed circuit board 1106, which may be contained in an end-user system 1107.

System 1100 may be used in a wide variety of applications, such as computer networking, data networking, instrumentation, video processing, digital signal processing, or any other application where the advantage of using programmable or reprogrammable logic is desirable. PLD 10a/b/c can be used to perform a variety of different logic functions. For example, PLD 10a/b/c can be configured as a processor or controller that works in cooperation with processor 1104. PLD 10a/b/c may also be used as an arbiter for arbitrating access to a shared resource in system 1100. In yet another example, PLD 10a/b/c can be configured as an interface between processor 1104 and one of the other components in system 1100. It should be noted that system 1100 is only exemplary, and that the true scope and spirit of the invention should be indicated by the following claims.

Various technologies can be used to implement PLD 10a/b/c employing the above-described routing channels in accordance with this invention, as well as the various components included therein. For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc.

The various components of PLCs can be controlled by various programmable, function control elements (FCEs). (With certain PLC implementations (e.g., fuses and metal optional links) separate FCE devices are not required.) FCEs can be implemented in any of several different ways. For example, FCEs can be SRAMs, DRAMs, first-in first-out (FIFO) memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement.

Thus it is seen that PLDs with routing channels for FSBs that are configured to reduce resource utilization have been provided. One skilled in the art will appreciate that the present invention can be practiced by other than the described embodiments, which are presented for purposes of illustration and not of limitation, and the present invention is limited only by the claims that follow.

What is claimed is:

1. A programmable logic device, comprising:
a plurality of programmable logic blocks disposed on the device in a two-dimensional array of intersecting rows and columns;
a plurality of function-specific blocks (FSBs) arranged in an additional column included within the two-dimensional array, wherein each FSB includes circuitry at least partly hardwired to perform a specific function on at least one multi-bit FSB input signal to generate at least one multi-bit FSB output signal; and
an output routing channel extending along the plurality of FSBs, wherein the output routing channel is programmably configurable to perform processing operations on the multi-bit FSB output signals generated by the plurality of FSBs.

2. The device defined in claim 1, wherein the output routing channel is further programmably configurable to concurrently perform a plurality of separate processing operations on the associated multi-bit FSB output signals generated by different subpluralities of FSBs.

3. The device defined in claim 1, wherein the output routing channel includes a plurality of functional units, wherein each functional unit has at least one functional unit input and at least one functional unit output, and is programmably selectively configurable to:
receive an associated multi-bit FSB output signal from a respective one of the FSBs in the plurality of FSBs,
perform an elementary operation on the associated multi-bit FSB output signal to generate a functional unit output signal, and
provide the functional unit output signal to at least one of a plurality of signal destinations.

4. The device defined in claim 3, wherein the plurality of functional units contained within the output routing channel are serially-aligned and are programmably selectively chainable.

5. The device defined in claim 3, wherein each functional unit contains an operational block that is configured to perform the elementary operation on at least one operational block input signal in generating at least one operational block output signal, wherein the associated multi-bit FSB output signal received by the functional unit is provided to the operational block contained therein as a first operational block input signal.

6. The device defined in claim 5, wherein each functional unit further contains output selection logic, wherein the output selection logic is programmably selectively configurable for operation in a plurality of modes for programmably selectively passing the functional unit output signal to least one of the plurality of signal destinations, wherein
in a first mode, the output selection logic is configured to selectively pass the associated multi-bit FSB output signal received by the functional unit as the functional unit output signal, and
in a second mode, the output selection logic is configured to selectively pass the operational block output signal as the functional unit output signal.

7. The device defined in claim 6, further comprising general interconnection resources configured to convey signals to, from, and amongst the programmable logic blocks, wherein
a first signal destination in the plurality of signal destinations is the general interconnection resources, and
a second signal destination in the plurality of signal destinations is an associated functional unit input of a neighboring functional unit.

8. The device defined in claim 7, wherein the neighboring functional unit is configured to receive the functional unit output signal as a second operational block input signal to an associated operational block contained within that neighboring functional unit.

9. The device defined in claim 8, wherein the associated elementary operation performed by the associated operational block contained within the neighboring functional unit is a combination function that arithmetically combines its associated first operational block input signal with its associated second operational block input signal.

10. The device defined in claim 1, further comprising:
general interconnection resources configured to convey signals amongst the plurality of programmable logic blocks; and
an input routing channel extending along the plurality of FSBs, wherein the input routing channel contains a plurality of input processing blocks, each input processing block being associated with a respective one of the FSBs and being configured to programmably selectively accept at least one signal from the general interconnection resources and to generate at least one multi-bit FSB input signal to be conveyed to an associated FSB.

11. The device defined in claim 10, wherein each input processing block contains registering and selection logic, wherein the registering and selection logic is configured to programmably selectively generate registered multi-bit FSB input signals.

12. The device defined in claim 11, wherein each input processing block further contains processing circuitry configured to perform logic operations on at least one signal accepted from the general interconnection resources to generate at least one multi-bit FSB input signal.

13. The device defined in claim 11, wherein the input routing channel further contains common routing resources that span adjacent to the plurality of input processing blocks, wherein the common routing resources are programmably selectively connectable to the registering and selection logic within each input processing block.

14. A data processing system comprising:
processing circuitry;
a system memory coupled to the processing circuitry; and
the device defined in claim 1 coupled to the processing circuitry and the system memory.

15. A printed circuit board on which is mounted the device defined in claim 1.

16. The printed circuit board defined in claim 15 further comprising:
a board memory mounted on the printed circuit board and coupled to the device; and
processing circuitry mounted on the printed circuit board and coupled to the device.

17. A programmable logic device, comprising:
a plurality of programmable logic blocks disposed on the device in a two-dimensional array of intersecting rows and columns;
a plurality of multipliers arranged in an additional column included within the two-dimensional array, wherein each multiplier includes circuitry that is at least partly hardwired to multiply a plurality of multi-bit input signals to generate a multi-bit output signal; and an output routing channel extending along the plurality of multipliers, wherein the output routing channel is programmably configurable to perform processing operations on the multi-bit output signals generated by the plurality of multipliers.

18. The device defined in claim 17, wherein the output routing channel contains a plurality of adders arranged in a programmably selectively-chainable adder chain, wherein each adder is configured to add a first adder input signal to a second adder input signal to generate an adder output signal.

19. The device defined in claim 18, wherein the output routing channel further includes programmable input/output selection circuitry between each pair of adders in the adder chain, wherein the programmable input/output selection circuitry is configured to programmably selectively pass an associated adder output signal of a first adder in the pair to a second adder in the pair as an associated first adder input signal for the second adder.

20. The device defined in claim 19, wherein the programmable input/output selection circuitry between each pair of adders includes register circuitry configured to register the associated adder output signal generated by the first adder, and wherein the programmable input/output selection circuitry is further configured to programmably select between an unregistered and a registered version of the associated adder output signal of the first adder to be conveyed as the associated first adder input signal to the second adder.

21. The device defined in claim 18, wherein the associated multi-bit output signal of each multiplier in the plurality of multipliers is applied as a second adder input signal to a respective one of the adders in the adder chain.

22. The device defined in claim 17, further comprising:

general interconnection resources configured to convey signals amongst the plurality of programmable logic blocks; and an input routing channel extending along the plurality of multipliers, wherein the input routing channel contains a plurality of input processing blocks, each input processing block being associated with a respective one of the multipliers and being configured to programmably selectively accept signals from the general interconnection resources and to generate an associated plurality of multi-bit input signals to be conveyed to its associated multiplier.

23. The device defined in claim 22, wherein each input processing block contains registering and selection logic, wherein the registering and selection logic is configured to programmably selectively generate registered multi-bit input signals.

24. The device defined in claim 22, wherein the input routing channel contains a common input bus that spans adjacent to and is programmably selectively connectable to the plurality of input processing blocks, and wherein the common input bus includes registering and selection circuitry configured to programmably selectively convey registered data to each input processing block.

25. The device defined in claim 24, further comprising a feedback conductor configured to convey results from the processing operations performed in the output routing channel to the common input bus.

26. A data processing system comprising:

processing circuitry;

a system memory coupled to the processing circuitry; and the device defined in claim 17 coupled to the processing circuitry and the system memory.

27. A printed circuit board on which is mounted the device defined in claim 17.

28. The printed circuit board defined in claim 27 further comprising:

a board memory mounted on the printed circuit board and coupled to the device.

29. The printed circuit board defined in claim 27 further comprising:

processing circuitry mounted on the printed circuit board and coupled to the device.

30. A programmable logic device, comprising:

a plurality of programmable logic blocks disposed on the device in a two-dimensional array of intersecting rows and columns;

a plurality of multipliers arranged in an additional column included within the two-dimensional array; and means for performing processing operations on output signals generated by the plurality of multipliers, wherein the means for performing the processing operations are included in an output routing channel that extends along the plurality of multipliers.

31. The device defined in claim 30, wherein the output routing channel includes means for selectively adding and registering output signals generated by the plurality of multipliers, wherein the means for selectively adding and registering is programmably selectively configurable for operation in a plurality of modes, wherein in a first mode, the means for selectively adding and registering is programmably selectively configurable to process the output signals as a finite-impulse response filter.

32. The device defined in claim 31, wherein in a second mode, the means for selectively adding and registering is programmably selectively configurable to process the output signals as an adder chain.

33. The device defined in claim 30, further comprising:

means for conveying input signals destined for the plurality of multipliers, wherein the means for conveying input signals includes an input routing channel that extends along the plurality of multipliers.

34. A data processing system comprising:

processing circuitry;

a system memory coupled to the processing circuitry; and the device defined in claim 30 coupled to the processing circuitry and the system memory.

35. A printed circuit board on which is mounted the device defined in claim 30.

36. The printed circuit board defined in claim 35 further comprising:

a board memory mounted on the printed circuit board coupled to the device.

37. The printed circuit board defined in claim 35 further comprising:

processing circuitry mounted on the printed circuit board and coupled to the device.

* * * * *